(12) United States Patent
Kanaya

(10) Patent No.: US 12,142,714 B2
(45) Date of Patent: Nov. 12, 2024

(54) DISPLAY DEVICE

(71) Applicant: Japan Display Inc., Tokyo (JP)

(72) Inventor: Yasuhiro Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 575 days.

(21) Appl. No.: 17/304,665

(22) Filed: Jun. 24, 2021

(65) Prior Publication Data

US 2021/0313496 A1 Oct. 7, 2021

Related U.S. Application Data

(63) Continuation of application No. PCT/JP2019/044442, filed on Nov. 12, 2019.

(30) Foreign Application Priority Data

Dec. 25, 2018 (JP) ................. 2018-241216

(51) Int. Cl.
*H01L 33/60* (2010.01)
*H01L 25/075* (2006.01)

(52) U.S. Cl.
CPC .......... *H01L 33/60* (2013.01); *H01L 25/0753* (2013.01)

(58) Field of Classification Search
CPC ............................ H10K 59/878; H10K 59/126
See application file for complete search history.

(56) References Cited

U.S. PATENT DOCUMENTS

| | | |
|---|---|---|
| 2003/0193457 A1 | 10/2003 | Wang et al. |
| 2010/0201609 A1 | 8/2010 | Kim |
| 2016/0308168 A1 | 10/2016 | Lee et al. |
| 2017/0338292 A1 | 11/2017 | Choi et al. |
| 2020/0105842 A1* | 4/2020 | Qi .................. G02F 1/155 |

FOREIGN PATENT DOCUMENTS

| | | |
|---|---|---|
| JP | 2003-076302 A | 3/2003 |
| JP | 2003-316295 A | 11/2003 |
| JP | 2017-521859 A | 8/2017 |
| WO | WO 2015/193434 A2 | 12/2015 |

OTHER PUBLICATIONS

International Search Report issued Feb. 18, 2020 in PCT/JP2019/044442 filed on Nov. 12, 2019, 3 pages.

* cited by examiner

*Primary Examiner* — Yu-Hsi D Sun
(74) *Attorney, Agent, or Firm* — Maier & Maier, PLLC

(57) ABSTRACT

According to one embodiment, a display device includes a substrate, a base layer, a plurality of light emitting elements, a resin layer, and a light reflecting layer. The resin layer is provided on the base layer, is filled in a gap between the light emitting elements, and has a flat surface. The light reflecting layer is provided above the flat surface, and includes a mirror surface and a plurality of openings.

6 Claims, 14 Drawing Sheets

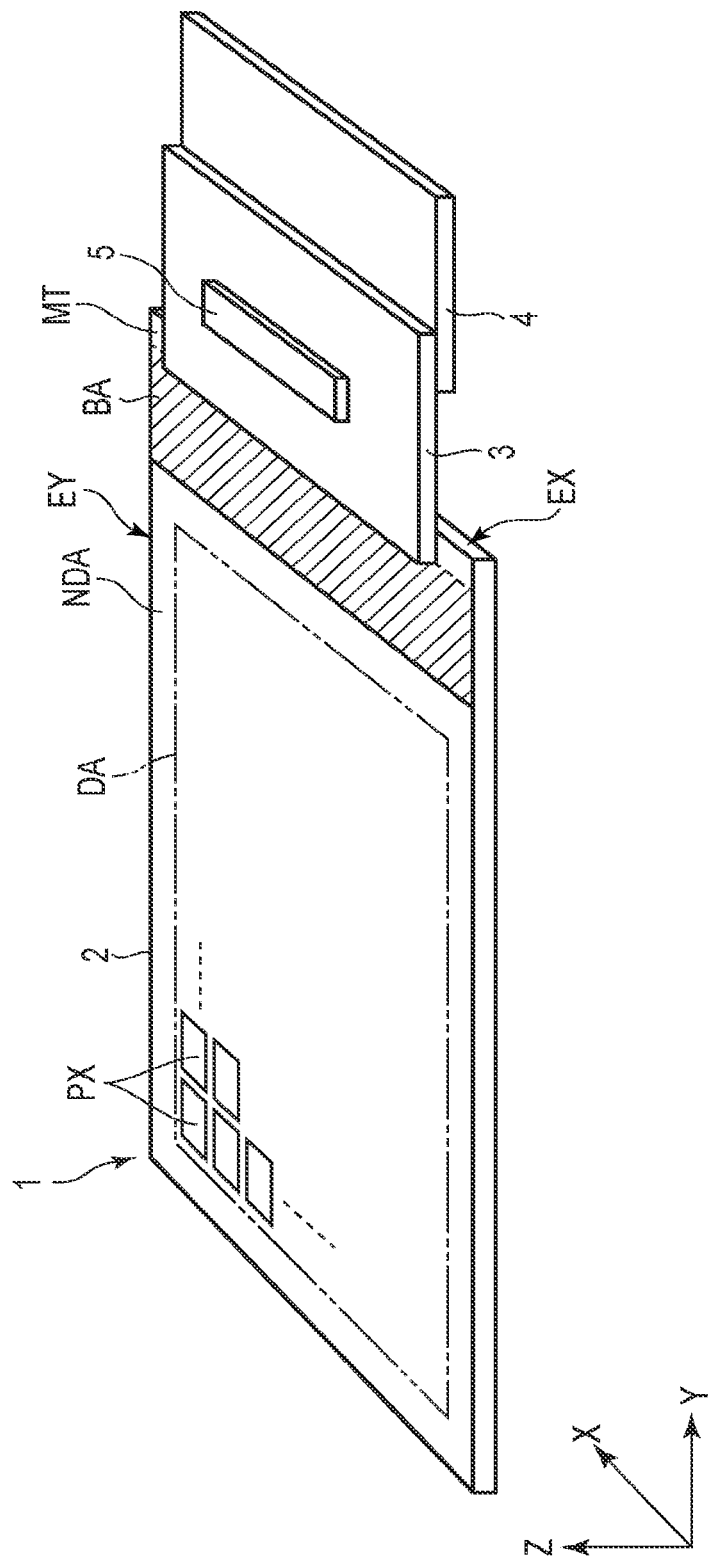
F I G. 1

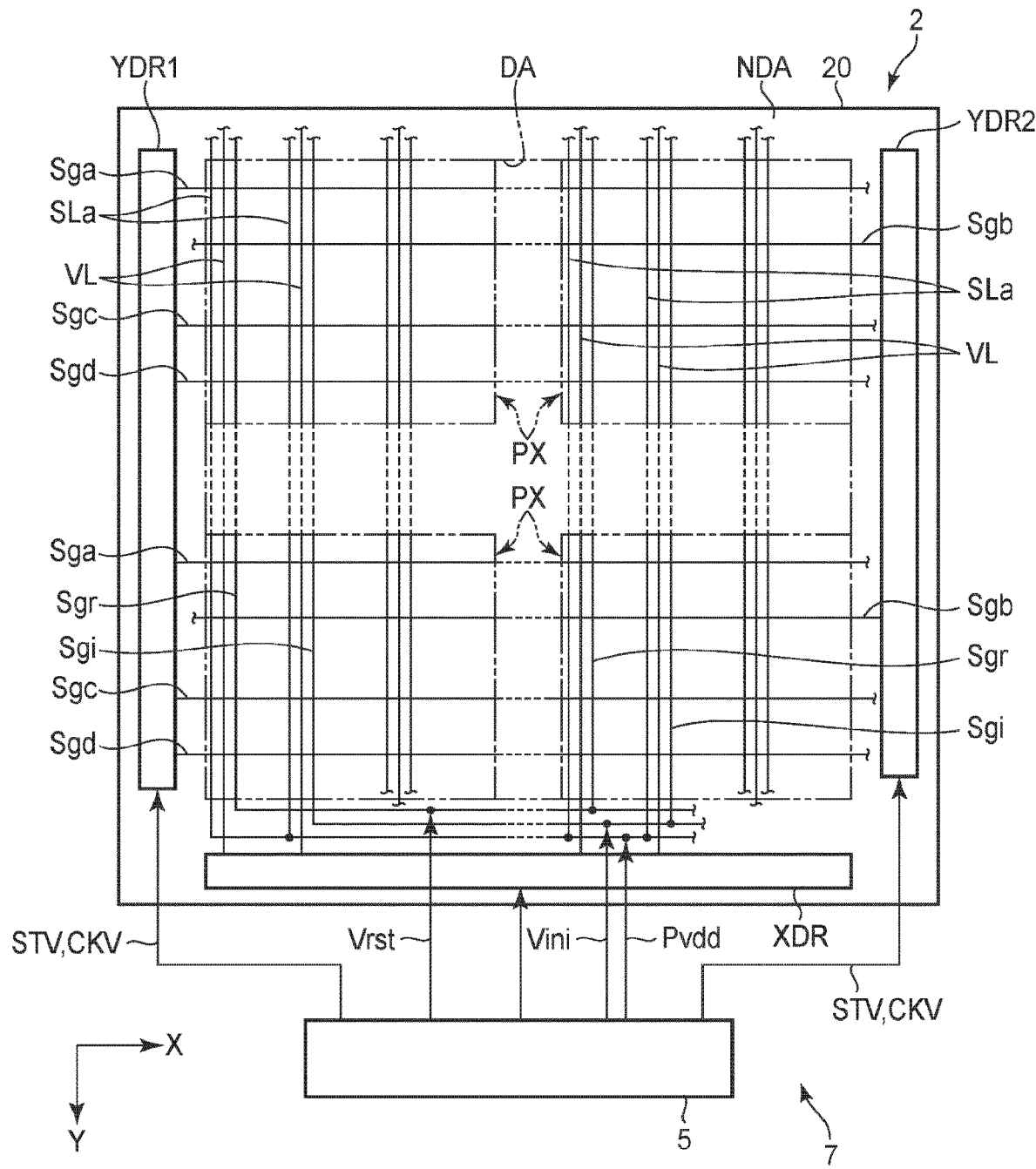
F I G. 2

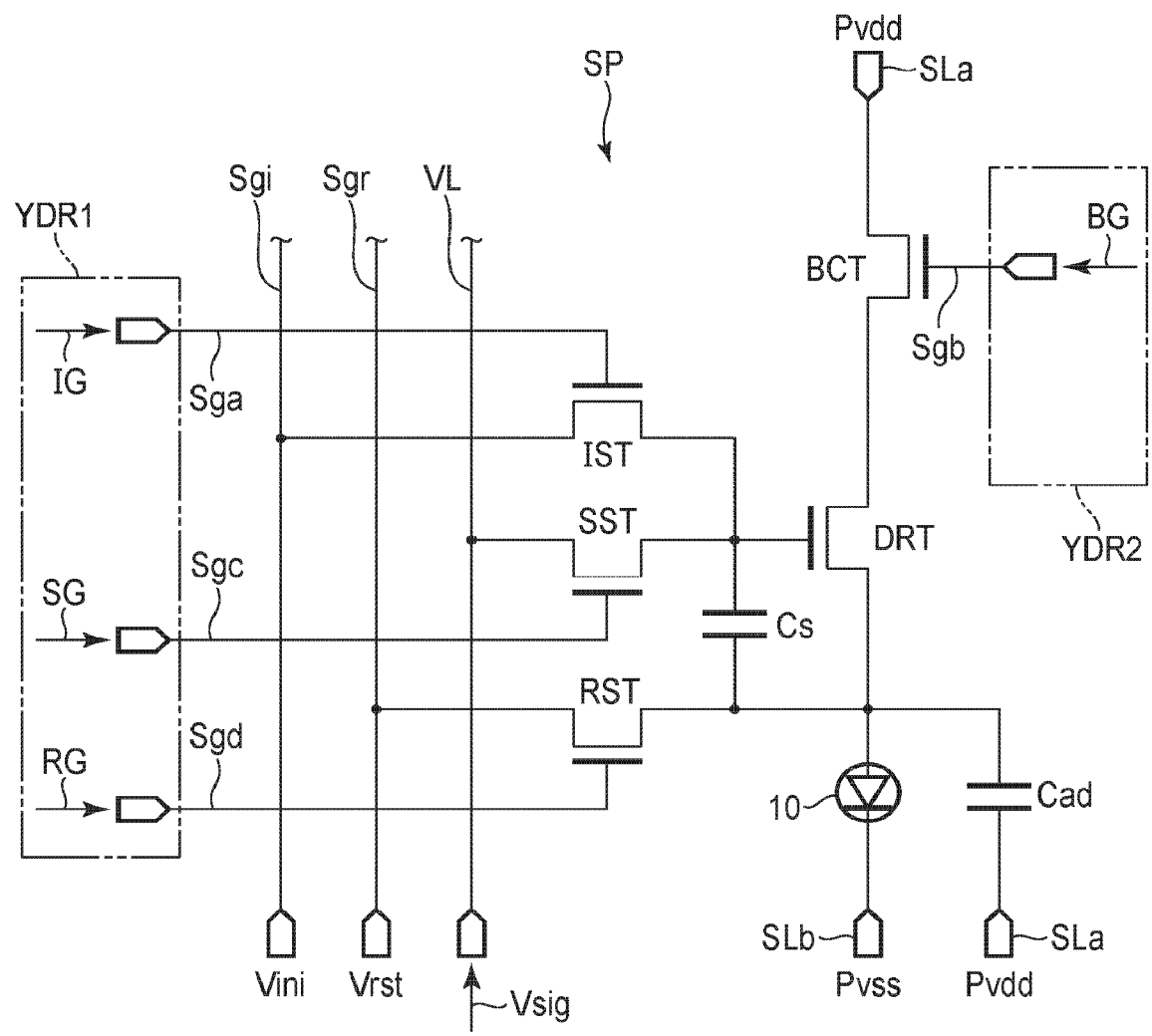
F I G. 3

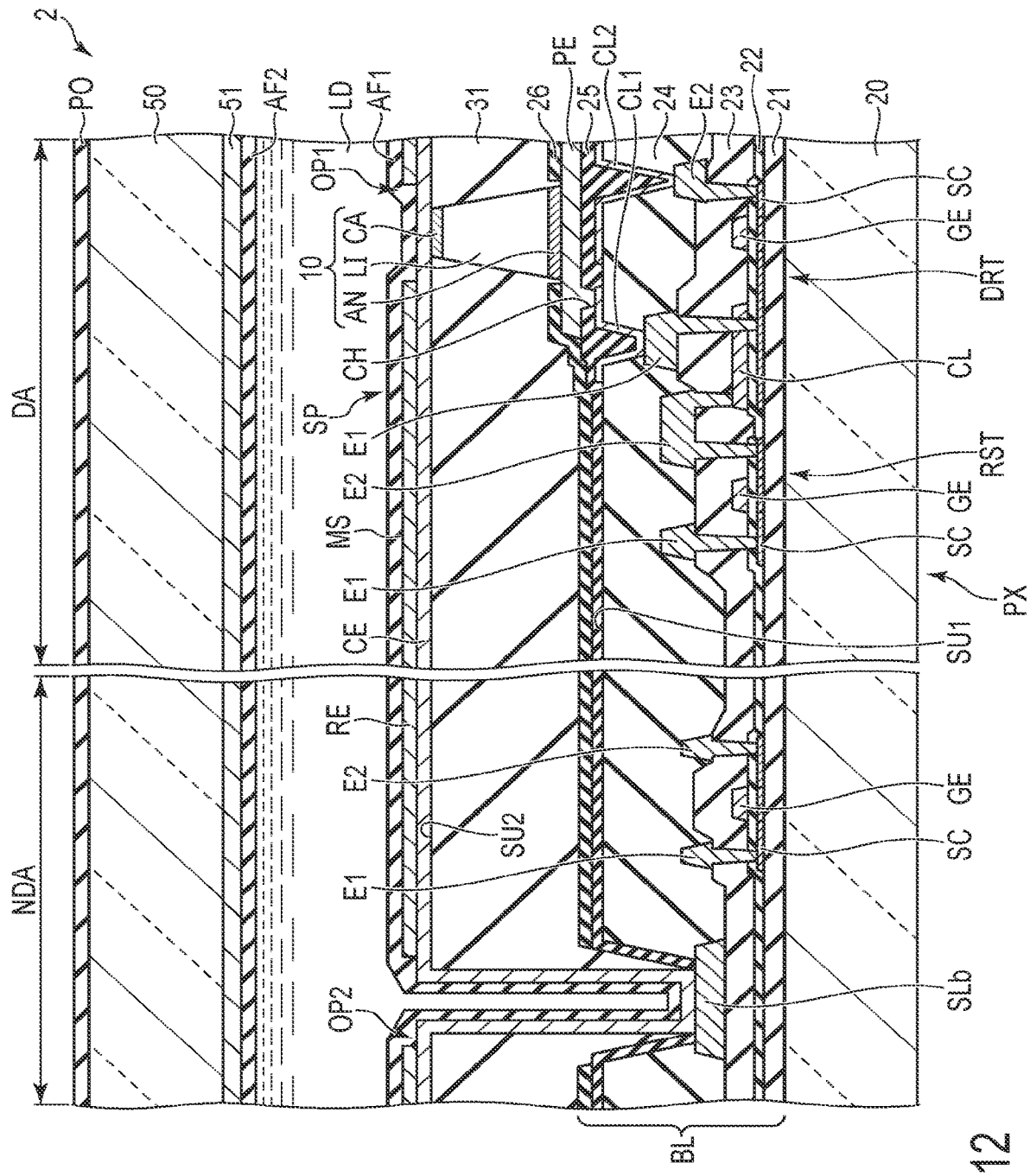
F I G. 12

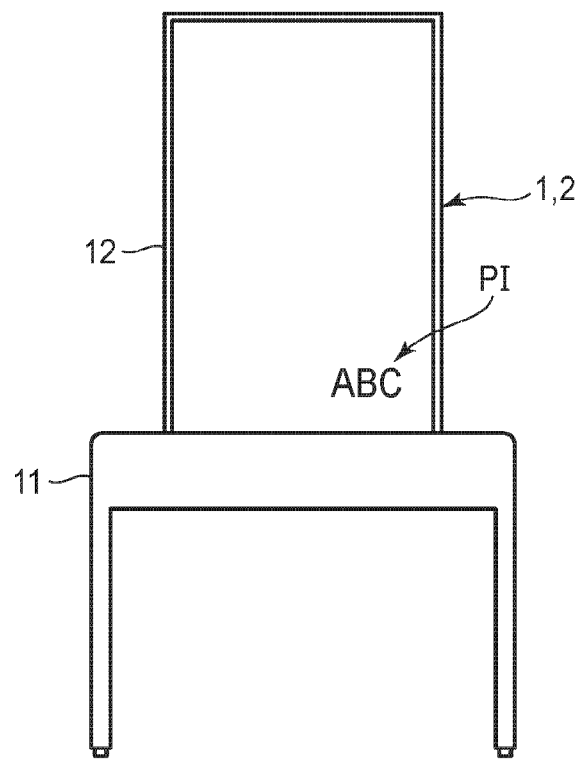
F I G. 15
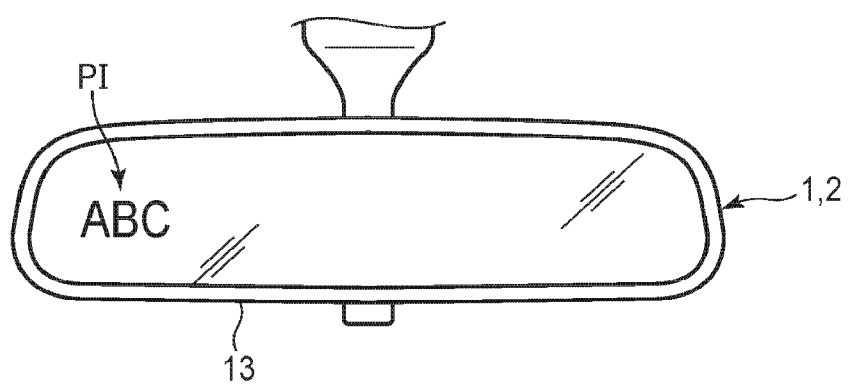
F I G. 16

1

DISPLAY DEVICE

CROSS-REFERENCE TO RELATED APPLICATIONS

This application is a Continuation Application of PCT Application No. PCT/JP2019/044442, filed Nov. 12, 2019 and based upon and claiming the benefit of priority from Japanese Patent Application No. 2018-241216, filed Dec. 25, 2018, the entire contents of all of which are incorporated herein by reference.

FIELD

Embodiments described herein relate generally to a display device.

BACKGROUND

Generally, a mirror display in which a display device is incorporated into a mirror is known. The mirror display includes a display device such as a liquid crystal display device and an organic electroluminescent (EL) display device, and a translucent mirror located on the screen side of the display device. The user can visually identify the images displayed by the display device through the translucent mirror.

The reflectance of the translucent mirror is lower than that of a reflecting mirror. It is thus difficult to add an image reflected by the translucent mirror and an image displayed by the display device. In addition, the transmittance of the image displayed by the display device is lowered by the translucent mirror.

BRIEF DESCRIPTION OF THE DRAWINGS

FIG. 1 is a perspective view showing a configuration of a display device according to a first embodiment.

FIG. 2 is a circuit diagram showing the display device.

FIG. 3 is an equivalent circuit diagram showing a sub-pixel in the first embodiment.

FIG. 12 is a partial sectional view showing a display panel of a display device according to a third embodiment.

FIG. 15 is an illustration showing an example in which the display device (display panel) is applied to a mirror on a dresser.

FIG. 16 is an illustration showing an example in which the display device (display panel) is applied to an inner rearview mirror.

DETAILED DESCRIPTION

Figure 4:
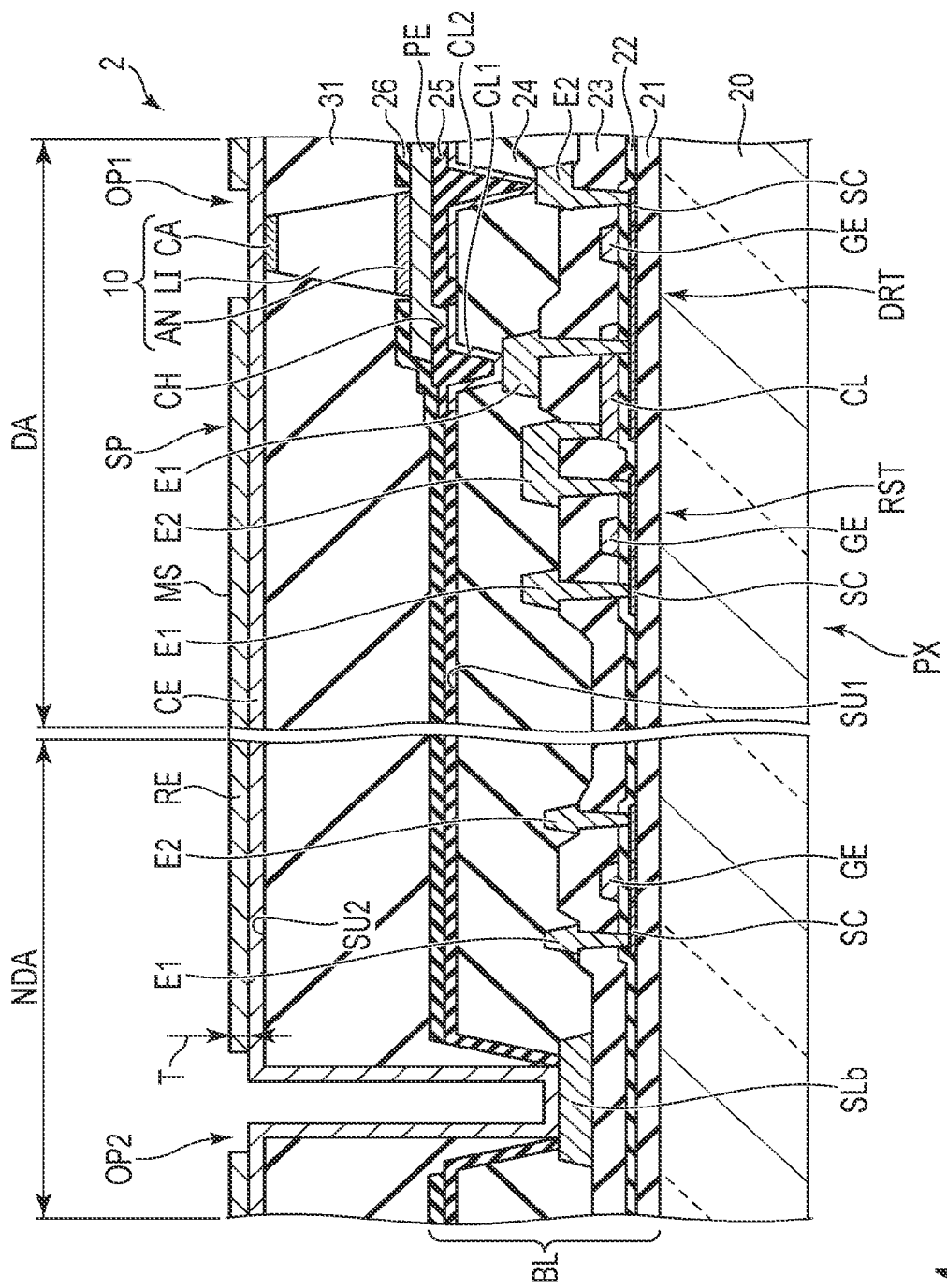
FIG. 4 is a partial sectional view showing a display panel shown in FIG. 1.

In general, according to one embodiment, there is provided a display device comprising a substrate, a base layer provided on the substrate, a plurality of light emitting elements mounted on the base layer, a resin layer provided on the base layer, filled in a gap between the light emitting elements, and having a flat surface on an opposite side of a surface facing the base layer, and a light reflecting layer provided above the flat surface and including a mirror surface located on an opposite side of a surface facing the flat surface and a plurality of openings overlapping the light emitting elements.

According to another embodiment, there is provided a display device comprising a substrate, a base layer provided on the substrate, a plurality of light emitting elements mounted on the base layer, a light reflecting layer provided above the base layer and including a mirror surface located on an opposite side of a surface facing the base layer and a plurality of openings overlapping the light emitting elements, a transparent conductive layer opposed to the mirror surface and disposed in the mirror surface with a gap, and a dimming layer located between the light reflecting layer and the transparent conductive layer.

Embodiments will be described hereinafter with reference to the accompanying drawings. The disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same elements as those described in connection with preceding drawings are denoted by like reference numerals, and a detailed description thereof is omitted unless otherwise necessary.

First Embodiment

First, a display device according to a first embodiment will be described. FIG. 1 is a perspective view showing a configuration of a display device 1 according to the first embodiment. FIG. 1 shows a three-dimensional space defined by a first direction X, a second direction Y perpendicular to the first direction X, and a third direction Z perpendicular to the first direction X and the second direction Y. Note that the first and second directions X and Y are orthogonal to each other, but may intersect at an angle other than 90°. In the present embodiment, the third direction Z is defined as an upward direction, and a direction opposite to the third direction Z is defined as a downward direction. When the phrases "a second member on a first member" and "a second member under a first member" are used, the second member may be in contact with the first member or may be away from the first member.

A case where the display device 1 of the present embodiment is a micro light emitting diode (referred to as micro LED hereinafter) display device using a micro LED that is a spontaneous light emitting element will be mainly described.

As shown in FIG. 1, the display device 1 includes a display panel 2, a first circuit substrate 3, a second circuit substrate 4 and the like. The display panel 2 is rectangular, for example. In the shown example, the short sides EX of the display panel 2 are parallel to the first direction X, and the long sides EY of the display panel 2 are parallel to the second direction Y. The third direction Z corresponds to the thickness direction of the display panel 2. The main surface of the display panel 2 is parallel to the X-Y plane defined by the first and second directions X and Y. The display panel 2 includes a display area DA and a non-display area NDA other than the display area DA. The non-display area NDA includes a terminal area MT. In the shown example, the non-display area NDA surrounds the display area DA.

The display area DA is an area to display an image, and includes a plurality of pixels PX arranged in a matrix, for example. In the present embodiment, the shape of the display area DA is a rectangle quadrangle; however, it is not limited thereto but may be a polygon other than the quadrangle, a circle, and the like. The size of the display area DA is larger than that of the non-display area NDA; however, it is not limited thereto but may be smaller than that of the non-display area NDA.

The terminal area MT is provided along the short side EX of the display panel 2 and includes terminals for electrically connecting the display panel 2 to an external device and the like.

The first circuit substrate 3 is mounted on the terminal area MT and electrically connected to the display panel 2. The first circuit substrate 3 is, for example, a flexible printed circuit. The first circuit substrate 3 includes, for example, a driver IC chip (hereinafter referred to as a panel driver) 5 that drives the display panel 2. In the example shown, the panel driver 5 is mounted on the top of the first circuit substrate 3, but may be mounted on the underside thereof. Alternatively, the panel driver 5 may be mounted on a member other than the first circuit substrate 3, such as the second circuit substrate 4. The second circuit substrate 4 is, for example, a flexible printed circuit. The second circuit substrate 4 is connected to, for example, the underside of the first circuit substrate 3.

The panel driver 5 is connected to a control board (not shown) via the second circuit substrate 4, for example. The panel driver 5 drives a plurality of pixels PX based on, for example, a video signal output from the control board to perform control for displaying an image on the display panel 2.

Note that the display panel 2 may have a bend area BA indicated by hatching. The bend area BA is an area that is bent when the display device 1 is held in the housing. The bend area BA is located alongside the terminal area MT of the non-display area NDA. While the bend area BA is bent, the first and second circuit substrates 3 and 4 are disposed below the display panel 2 so as to face the display panel 2.

FIG. 2 is a circuit diagram of the display device 1. FIG. 3 is an equivalent circuit diagram showing a sub-pixel SP in the present embodiment. FIG. 2 does not show all of various wiring lines.

As shown in FIGS. 2 and 3, the display panel 2 includes an insulating substrate (substrate) 20 having optical transparency, a plurality of pixels PX arranged in a matrix on the insulating substrate 20 in the display area DA, various wiring lines, scanning line driving circuits YDR1 and YDR2, and a signal line driving circuit XDR.

The wiring lines include a plurality of first scanning lines Sga, a plurality of second scanning lines Sgb, a plurality of third scanning lines Sgc, a plurality of fourth scanning lines Sgd, a plurality of video signal lines VL, a plurality of high-potential power supply lines SLa, a plurality of reset wiring lines Sgr, and a plurality of initialization wiring lines Sgi.

In the present embodiment, the first, third and fourth scanning lines Sga, Sgc and Sgd are connected to the scanning line driving circuit YDR1 and provided to extend in the first direction X. The second scanning lines Sgb are connected to the scanning line driving circuit YDR and provided to extend in the first direction X. The video signal lines VL are connected to the signal line driving circuit XDR and provided to extend in the second direction Y. The high-potential power supply lines SLa, reset wiring lines Sgr and initialization wiring lines Sgi are provided to extend in the second direction Y. The display panel 2 includes low-potential power supply lines SLb fixed at a low potential Pvss as well as the high-potential power supply lines SLa fixed at a high potential Pvdd. The high-potential power supply lines SLa are connected to a high-potential power supply, and the low-potential power supply lines SLb are connected to a low-potential power supply.

The scanning line driving circuit YDR1 is configured to drive the first, third and fourth scanning lines Sga, Sgc and Sgd. The scanning line driving circuit YDR2 is configured to drive the second scanning lines Sgb. The signal line driving circuit XDR is configured to drive the video signal lines VL. The scanning line driving circuits YDR1 and YDR2 and the signal line driving circuit XDR are formed on the insulating substrate 20 in the non-display area NDA to configure a driver 7 together with the panel driver 5.

Each of the pixels PX includes a plurality of sub-pixels SP. Each sub-pixel SP includes a light emitting element 10 and a pixel circuit that applies a drive current to the light emitting element 10. The light emitting element 10 is, for example, a self-light emitting element and, in the present embodiment, it is a micro light emitting diode (LED). The display device 1 of the present embodiment is a micro LED display device.

The pixel circuit of each sub-pixel SP is a voltage signal type pixel circuit that controls the light emission of the light emitting element 10 in accordance with a video signal Vsig including voltage signals, and includes a reset switch RST, a pixel switch SST, an initialization switch IST, an output switch BCT, a drive transistor DRT, a storage capacitance Cs and an auxiliary capacitance Cad. The storage capacitance Cs and the auxiliary capacitance Cad are capacitors. The auxiliary capacitance Cad is an element provided to adjust the amount of light emission current, and may be unnecessary in some cases.

The reset switch RST, the pixel switch SST, the initialization switch IST, the output switch BCT and the drive transistor DRT are configured by thin-film transistors (TFTs). In the present embodiment, the reset switch RST, the pixel switch SST, the initialization switch IST, the output switch BCT and the drive transistor DRT are configured by TFTs of the same conductivity type such as an N-channel type. Note that one or more of the reset switch RST, the pixel switch SST, the initialization switch IST, the output switch BCT and the drive transistor DRT may be configured by P-channel type TFTs. In this case, the N-channel and P-channel type TFTs may be formed at the same time. The reset switch RST, the pixel switch SST, the initialization switch IST and the output switch BCT have only to function as switches, and need not be configured by TFTs.

In the display device 1 according to the present embodiment, the TFTs constituting the drive transistor DRT and the respective switches are all formed to have the same layer structure in the same process, and are thin-film transistors having a top-gate structure using polycrystalline silicon in a semiconductor layer. Note that the semiconductor layer may be formed using a semiconductor other than polycrystalline silicon, such as amorphous silicon and an oxide semiconductor.

The reset switch RST, the pixel switch SST, the initialization switch IST, the output switch BCT and the drive transistor DRT each include a first terminal, a second terminal and a control terminal. In the present embodiment, the first terminal is a source electrode, the second terminal is a drain electrode, and the control terminal is a gate electrode.

In the pixel circuit of the pixels PX, the drive transistor DRT and output switch BCT are connected in series to the light emitting element 10 between the high-potential power supply lines SLa and the low-potential power supply lines SLb. The high-potential power supply lines SLa (high potential Pvdd) are set to a potential of, for example, 10V, and the low-potential power supply lines SLb (low potential Pvss) are set to a potential of, for example, 1.5V.

In the output switch BCT, the drain electrode is connected to the high-potential power supply lines SLa, the source electrode is connected to the drain electrode of the drive transistor DRT, and the gate electrode is connected to the second scanning lines Sgb. Accordingly, the output switch BCT is controlled to turn on (conductive state) and turn off (non-conductive state) in response to a control signal BG applied to the second scanning lines Sgb. The output switch BCT controls the light emission time of the light emitting element 10 in response to the control signal BG.

In the drive transistor DRT, the drain electrode is connected to the source electrode of the output switch BCT, and the source electrode is connected to one of the electrodes (here, the anode) of the light emitting element 10. The other electrode thereof (here, the cathode) is connected to the low-potential power supply lines SLb. The drive transistor DRT supplies the light emitting element 10 with a drive current whose current amount corresponds to the video signal Vsig.

In the pixel switch SST, the source electrode is connected to the video signal lines VL, the drain electrode is connected to the gate electrode of the drive transistor DRT, and the gate electrode is connected to the third scanning line Sgc functioning as a gate wiring line for signal write control. The pixel switch SST is controlled to turn on and off in response to a control signal SG supplied from the third scanning lines Sgc. In response to the control signal SG, the pixel switch SST controls connection and disconnection between the pixel circuit and the video signal lines VL and captures the video signal Vsig from the video signal lines VL into the pixel circuit.

In the initialization switch IST, the source electrode is connected to the initialization wiring lines Sgi, the drain electrode is connected to the gate electrode of the drive transistor DRT, and the gate electrode is connected to the first scanning lines Sga. The initialization switch IST is controlled to turn on and off in response to a control signal IG supplied from the first scanning lines Sga. In response to the control signal IG, the initialization switch IST controls connection and disconnection between the pixel circuit and the initialization wiring lines Sgi. Connecting the pixel circuit and the initialization wiring lines Sgi in the initialization switch IST makes it possible to capture the initialization potential (initialization voltage) Vini into the pixel circuit from the initialization wiring lines Sgi.

The reset switch RST is connected between the source electrode of the drive transistor DRT and the reset wiring lines Sgr. The gate electrode of the reset switch RST is connected to the fourth scanning line Sgd functioning as a gate wiring line for reset control. As described above, the reset wiring lines Sgr are connected to a reset power supply and fixed to a reset potential Vrst that is a constant potential. The reset switch RST is switched to a conductive (ON) state or a non-conductive (OFF) state in response to the control signal RG supplied through the fourth scanning line Sgd. Switching the reset switch RST to the ON state makes it possible to reset the potential of the source electrode of the drive transistor DRT to the reset potential Vrst.

The storage capacitance Cs is connected between the gate electrode and source electrode of the drive transistor DRT. The auxiliary capacitance Cad is connected between the source electrode of the drive transistor DRT and the high-potential power supply lines SLa serving as constant potential lines.

The panel driver 5 shown in FIG. 2 controls the scanning line driving circuits YDR1 and YDR2 and the signal line driving circuit XDR. Upon receiving a digital video signal and a synchronization signal from outside, the panel driver 5 generates a vertical scanning control signal for controlling vertical scanning timing and a horizontal scanning control signal for controlling horizontal scanning timing based on the synchronization signal.

The panel driver 5 then supplies the vertical and horizontal scanning control signals to the scanning line driving circuits YDR1 and YDR2 and the signal line driving circuit XDR, and supplies the digital video signal and the initialization signal to the signal line driving circuit XDR in synchronization with the horizontal and vertical scanning timings.

The signal line driving circuit XDR converts video signals, which are obtained in sequence in each horizontal scanning period under the control of the horizontal scanning control signals, into analog signals, and supplies video signals Vsig corresponding to the gradation to the video signal lines VL. The panel driver 5 fixes the high-potential power supply lines SLa to the high potential Pvdd, fixes the reset wiring lines Sgr to the reset potential Vrst, and fixes the initialization wiring lines Sgi to the initialization potential Vini. Note that the potential of the high-potential power supply lines SLa, the potential of the reset wiring lines Sgr, and the potential of the initialization wiring lines Sgi may be set via the signal line driving circuit XDR.

The panel driver 5 supplies the scanning line driving circuits YDR1 and YDR2 with start pulse signals STV, clock signals CKV and the like.

The scanning line driving circuits YDR1 and YDR2 include shift registers, output buffers (not shown) and the like to transfer the start pulse signals STV in sequence to the shift registers in the subsequent stages and supply four different control signals, i.e., control signals IG, BG, SG and RG, to the sub-pixels SP of respective rows via the output buffers. Thus, the first scanning lines Sga, second scanning lines Sgb, third scanning lines Sgc and fourth scanning lines Sgd are driven by their respective control signals IG, BG, SG and RG.

The structure of each of the drive transistor DRT, the reset switch RST, a pixel electrode PE, the light emitting element 10, the low-potential power supply line SLb, a common electrode CE, a light reflecting layer RE and the like will be described with reference to FIG. 4. FIG. 4 is a partial sectional view of the display panel 2 shown in FIG. 1. In FIG. 4, the display panel 2 is so depicted that its display surface, i.e., its light emitting surface faces upward and its back surface faces downward.

As shown in FIG. 4, the display panel 2 includes an insulating substrate 20, insulating layers 21, 22, 23, 24, 25 and 26, which are provided on and above the insulating substrate 20, and a plurality of pixels PX. The pixels PX are provided above the insulating substrate 20, are located in the display area DA, and include sub-pixels SP of a plurality of colors.

As the insulating substrate 20, a glass substrate such as quartz and alkali-free glass, or a resin substrate such as polyimide can be mainly used. The insulating substrate 20 may be made of a material that is resistant to a processing temperature when a TFT is manufactured. When the insulating substrate 20 is a flexible resin substrate, the display device 1 can be configured as a sheet display. The resin substrate is not limited to polyimide but may be formed of other resin materials. When, for example, polyimide is used for the insulating substrate 20, it may be appropriate that the insulating substrate 20 is referred to as an organic insulating layer or a resin layer.

The insulating layer 21 is provided on the insulating substrate 20. A variety of types of TFTs are formed on the insulating layer 21. In the display area DA, the drive transistor DRT, the reset switch RST and the like are formed on the insulating layer 21. In the non-display area NDA, the TFT and the like which constitute the scanning line driving circuit YDR are formed on the insulating layer 21. The TFT such as the drive transistor DRT includes a semiconductor layer SC, a gate electrode GE, a first electrode E1 and a second electrode E2.

The semiconductor layer SC is disposed on the insulating layer 21. The insulating layer 22 is provided on the insulating layer 21 and the semiconductor layer SC. The gate electrode GE is disposed on the insulating layer 22 and opposed to the channel region of the semiconductor layer SC. The insulating layer 23 is provided on the insulating layer 22 and the gate electrode GE. The first and second electrodes E1 and E2 are disposed on the insulating layer 23. The first and second electrodes E1 and E2 are electrically connected to their corresponding semiconductor layers SC through contact holes formed in their respective insulating layers 22 and 23.

In the present embodiment, a conductive layer CL is formed on the insulating layer 22. The first electrode E1 of the drive transistor DRT is electrically connected not only to the corresponding semiconductor layer SC but also to the conductive layer CL. The second electrode E2 of the reset switch RST is electrically connected not only to the corresponding semiconductor layer SC but also to the conductive layer CL. Thus, the drive transistor DRT and the reset switch RST are electrically connected via the conductive layer CL.

In the non-display area NDA, the low-potential power supply line SLb is disposed on the insulating layer 23. The insulating layer 24 is provided on the insulating layer 23, first electrode E1, second electrode E2 and low-potential power supply line SLb.

The first and second conductive layers CL1 and CL2 are disposed on the insulating layer 24. The first conductive layer CL1 is electrically connected to the first electrode E1 through a contact hole formed in the insulating layer 24. The second conductive layer CL2 is electrically connected to the second electrode E2 through a contact hole formed in the insulating layer 24.

The insulating layer 25 is provided on the insulating layer 24, first conductive layer CL1 and second conductive layer CL2. The pixel electrode PE is disposed on the insulating layer 25. The pixel electrode PE is electrically connected to the first conductive layer CL1 through a contact hole CH formed in the insulating layer 25. The pixel electrode PE is electrically connected to the drive transistor DRT and supplied with a signal whose current value is controlled from the drive transistor DRT.

The insulating layer 26 is provided on the insulating layer 25 and the pixel electrode PE. Although not shown, the insulating layer 26 is located on a plurality of pixel electrodes PE to cover the pixel electrodes PE. The insulating layer 26 has an opening for mounting the light emitting element 10 on part of the surface of each of the pixel electrodes PE. The size of the opening of the insulating layer 26 is much larger than the light emitting element 10 in consideration of, for example, a mounting deviation amount in the process of mounting the light emitting element 10. For example, when the light emitting element 10 has a mounting area of approximately 4 μm×4 μm to 5 μm×5 μm, it is preferable that the above opening has an area of approximately 8 μm×8 μm to 10 μm×10 μm.

As described above, a base layer BL having a stacked structure from the insulating layer 21 to the insulating layer 26 is provided on the insulating substrate 20. The base layer BL includes, for example, a plurality of pixel electrodes PE.

The insulating layers 21, 22, 23, 24, 25 and 26 are formed of an inorganic insulating material or an organic insulating material. In the present embodiment, the insulating layers 21, 22, 23, 25 and 26 are formed of, for example, silicon oxide ($SiO_2$) or silicon nitride (SiN) as an inorganic insulating material.

The insulating layer 24 is formed of, for example, a photosensitive acrylic resin as a resin material. The insulating layer 24 has a flat surface SU1 that is the opposite side of the surface facing the insulating layer 23. The insulating layer 24 is therefore a planarization layer.

The semiconductor layer SC is formed of low-temperature polycrystalline silicon as polycrystalline silicon. However, the semiconductor layer SC may be formed of a semiconductor other than polycrystalline silicon, such as amorphous silicon and an oxide semiconductor. The gate electrode GE and the conductive layer CL are located in the same layer and formed of metal as the same conductive material. For example, the gate electrode GE and the conductive layer CL are formed of molybdenum tungsten (MoW).

The first electrode E1, second electrode E2 and low-potential power supply line SLb are located in the same layer and formed of metal as the same conductive material. For example, the first electrode E1, the second electrode E2 and the low-potential power supply line SLb each have a three-layer stacked structure (Ti/Al/Ti system), and includes a lower layer formed of titanium (Ti) and a metallic material containing Ti as a main component, such as an alloy including Ti, an intermediate layer formed of aluminum (Al) and a metallic material containing Al as a main component, such as an alloy including Al, and an upper layer formed of Ti and a metallic material containing Ti as a main component, such as an alloy including Ti. Although a top-gate TFT is described here as an example, a bottom-gate TFT may be used.

The switches such as the drive transistor DRT are covered with the insulating layer 24.

The first and second conductive layers CL1 and CL2 are located in the same layer and formed of metal or transparent conductive material as the same conductive material. The pixel electrodes PE are formed of metal as a conductive material. For example, the pixel electrodes PE each have a single conductive layer, a three-layer stacked structure or a two-layer stacked structure.

In the three-layer stacked structure, the pixel electrodes PE are not limited to the Ti/Al/Ti system but may be a Mo/Al/Mo system. In the Mo/Al/Mo system, each pixel electrode PE includes a lower layer formed of Mo (molybdenum) and a metallic material containing Mo as a main component, such as an alloy including Mo, an intermediate layer formed of Al and a metallic material containing Al as a main component, such as an alloy including Al, and an upper layer formed of Mo and a metallic material containing Mo as a main component, such as an alloy including Mo.

In the two-layer stacked structure, each pixel electrode PE includes a lower layer formed of a metallic material containing Al as a main component and an upper layer formed of a metallic material containing Ti as a main component. Alternatively, each pixel electrode PE includes a lower layer formed of a metallic material containing Mo as a main component and an upper layer formed of a metallic material containing Al as a main component. Note that the pixel electrodes PE may be formed of a transparent conductive material.

In the display area DA, a plurality of light emitting elements 10 are mounted on the base layer BL. Specifically, the light emitting elements 10 are mounted on the pixel electrodes PE. The light emitting elements 10 each include an anode AN as a first electrode, a cathode CA as a second electrode, and a light emitting layer LI that emits light. The light emitting elements 10 have emission colors of first color, second color and third color, and the anode AN is electrically connected to and fixed to its corresponding pixel electrode PE. In the present embodiment, the first color is red (R), the second color is green (G), and the third color is blue (B).

The junction between the anode AN of the light emitting element 10 and the pixel electrode PE is not particularly limited as long as it can maintain good conduction between them and does not damage the stacked structure from the insulating substrate 20 to the insulating layer 26. For example, a reflow process using a solder material melted at a low temperature, a method in which the light emitting elements 10 are placed on the pixel electrodes PE through conductive paste and then bonded by firing, or a solid phase bonding method such as ultrasonic bonding using the same material for the surfaces of the pixel electrodes PE and the anodes AN of the light emitting elements 10, can be adopted. The light emitting elements 10 each have the cathode CA on the opposite side of the anode AN electrically connected to the pixel electrode PE.

On the base layer BL on which the light emitting elements 10 are mounted, a resin layer 31 is provided. The resin layer 31 is filled in gaps between the light emitting elements 10. The resin layer 31 has a flat surface SU2 that is the opposite side of the surface facing the base layer BL. The resin layer 31 is therefore a planarization layer. The resin layer 31 is caused to expose the surface of the cathode CA of the light emitting element 10.

The common electrode CE is located at least in the display area DA and provided above the flat surface SU2. The common electrode CE is disposed on the resin layer 31 and the light emitting elements 10 to cover the light emitting elements 10 of the pixels. The common electrode CE is in contact with a plurality of cathodes CA and is electrically connected to the cathodes CA. The common electrode CE is shared by the sub-pixels SP.

The common electrode CE extends to the non-display area NDA, and is electrically connected to the low-potential power supply line SLb in the non-display area NDA. The common electrode CE is in contact with the low-potential power supply line SLb through contact holes formed in the resin layer 31, the insulating layer 26, the insulating layer 25 and the insulating layer 24. Thus, the common electrode CE is held at the same constant potential as the potential of the low-potential power supply line SLb, and electrically connects the low-potential power supply line SLb to the cathodes CA of all the light emitting elements 10.

The common electrode CE needs to be formed as a transparent electrode in order to cause the light emitting elements 10 to emit light. The common electrode CE is formed using, for example, ITO (indium tin oxide) as the transparent conductive material.

Note that the resin layer 31 has only to have a flat surface SU2 and may be formed so as not to reach the cathode CA of the light emitting element 10. On the surface on which the common electrode CE is formed, part of the unevenness caused by the mounting of the light emitting elements 10 remains, but the materials for forming the common electrode CE have only to be covered continuously without being stepped.

The light reflecting layer RE is provided above the flat surface SU2. The light reflecting layer RE is substantially located all over the display panel 2. The light reflecting layer RE is located at least in the display area DA. The light reflecting layer RE includes a mirror surface MS located on the opposite side of the surface facing the flat surface SU2, and a plurality of openings OP1 and OP2 superposed on the light emitting elements 10. Since the light reflecting layer RE is disposed above the flat surface SU2, the mirror surface MS is flat. The openings OP2 surround a contact portion between the common electrode CE and the low-potential power supply line SLb.

In the present embodiment, the light reflecting layer RE is located on the common electrode CE and is in contact with the common electrode CE. The light reflecting layer RE is formed of a metallic material such as silver (Ag) and Al as a light reflective material. Thus, the light reflecting layer RE is electrically connected to the common electrode CE. Note that the light reflecting layer RE may be located between the flat surface SU2 and the common electrode CE.

As described above, it is preferable that the light reflecting layer RE be electrically connected to the common electrode CE. This is because the electric resistance of the stacked layer body of the common electrode CE and light reflecting layer RE can be made lower than the single electric resistance of the common electrode CE.

The thickness T of the light reflecting layer RE is not particularly limited, but it is preferable that the thickness T be set so as to reflect external light sufficiently. It is also preferable that the thickness T be set so as to reflect light from the light emitting elements 10 sufficiently via the resin layer 31 and the common electrode CE. For example, when the light reflecting layer RE is formed of Ag, if its thickness T is 200 nm, it can sufficiently reflect the external light and the light from the light emitting elements 10.

The light reflecting layer RE constitutes a reflecting mirror. As compared with the translucent mirror, the light reflecting layer RE can obtain a higher light reflectance.

As described above, the display panel 2 has a structure from the insulating substrate 20 to the light reflecting layer RE. The display device 1 using the light emitting elements 10 according to the present embodiment as display elements is configured as described above, for example. If necessary, a cover member such as a cover glass, a touch panel substrate or the like may be provided on the common electrode CE.

Figure 5:
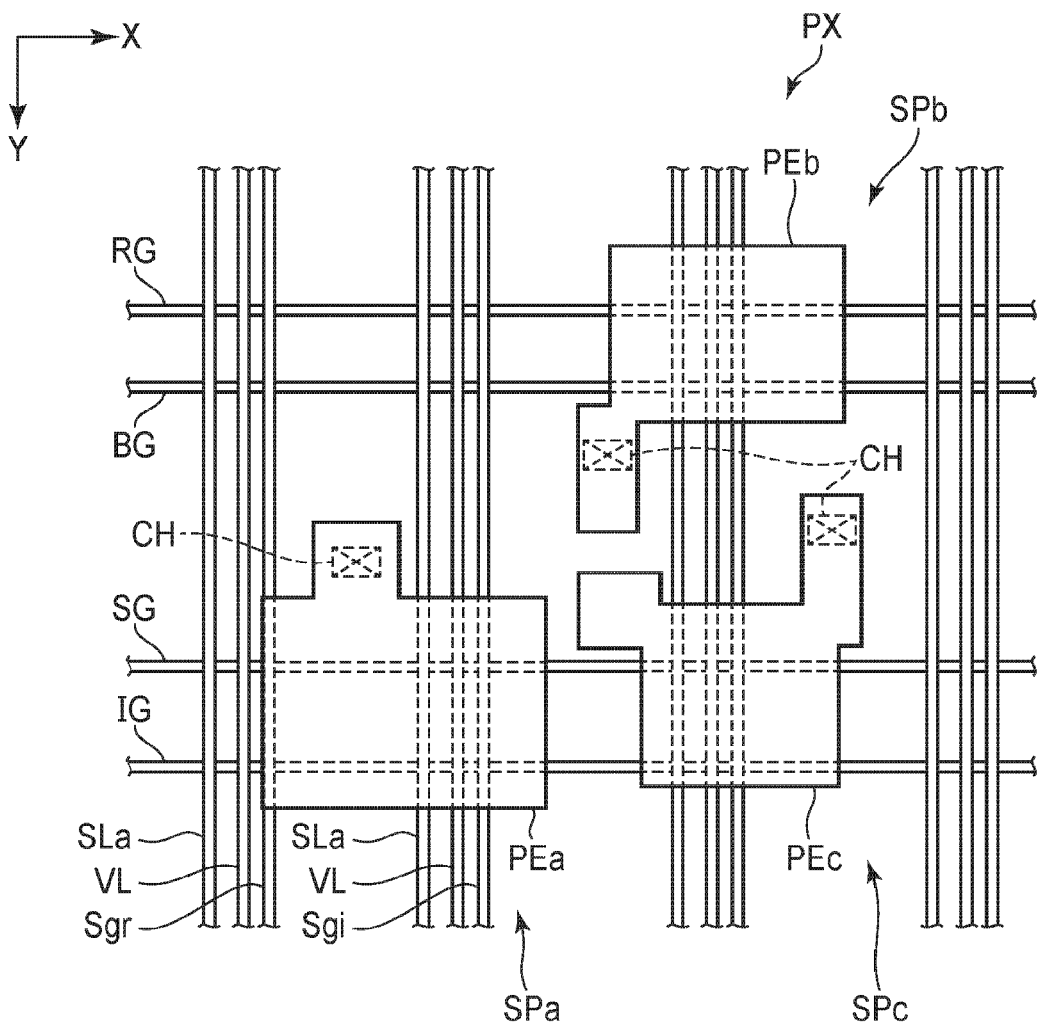
FIG. 5 is a plan view of the layout of pixel shown in FIG. 1, showing various types of wiring lines and pixel electrodes.

Next is a description of the layout of the pixels PX. FIG. 5 is a plan view of the layout of the pixels PX shown in FIG. 1, illustrating various wiring lines and the pixel electrodes PE.

As shown in FIG. 5, each of the pixels PX includes a plurality of sub-pixels SP. In the present embodiment, each pixel PX includes three sub-pixels SP of a first-color sub-pixel SPa, a second-color sub-pixel SPb and a third-color sub-pixel SPc. The sub-pixel SPa includes a pixel electrode PEa, the sub-pixel SPb includes a pixel electrode PEb and the sub-pixel SPc includes a pixel electrode PEc. The pixel electrode PEa is adjacent to the pixel electrode PEc at a distance in a first direction X. The pixel electrode PEb is adjacent to the pixel electrode PEc at a distance in a second direction Y.

Figure 6:
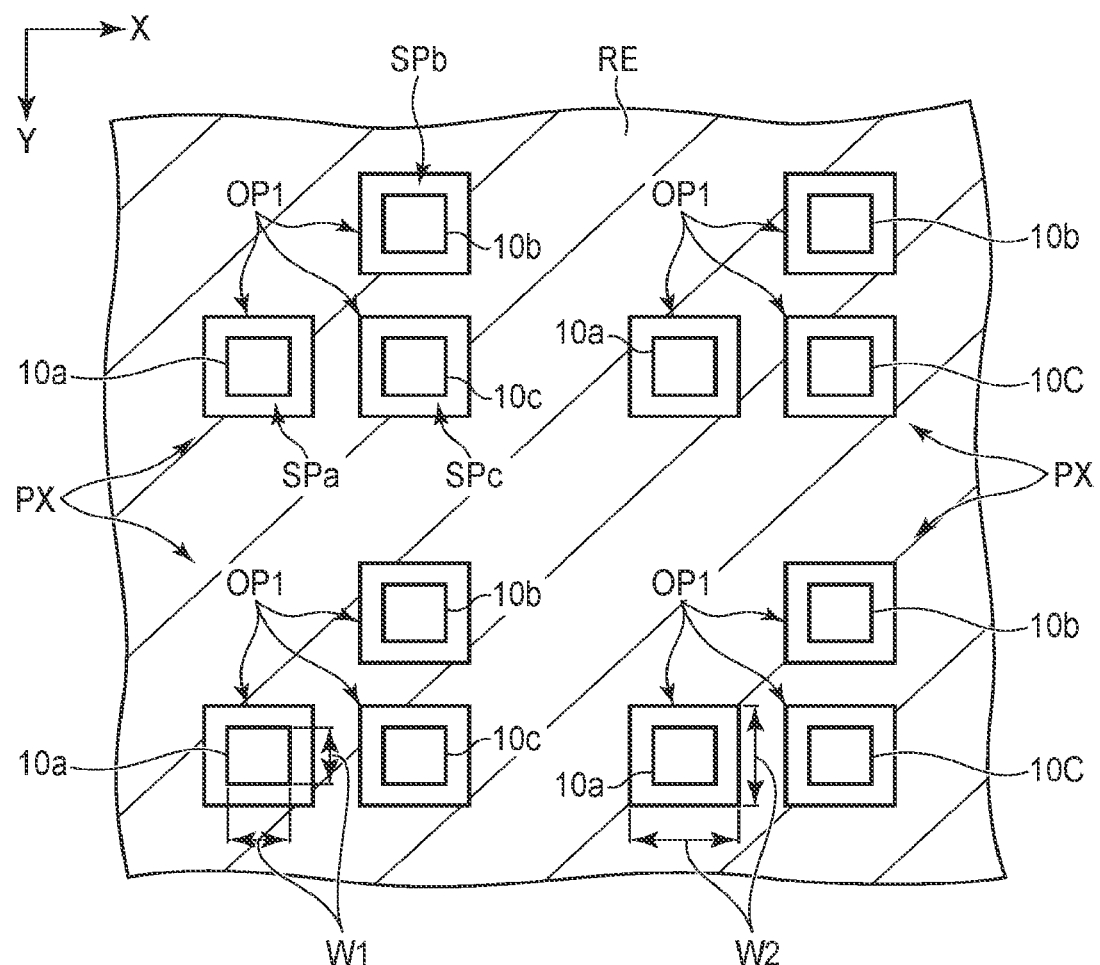
FIG. 6 is a plan view showing a plurality of light emitting elements and a light reflecting layer in the first embodiment.

Next is a description of the light emitting element 10 and the light reflecting layer RE. FIG. 6 is a plan view showing a plurality of light emitting elements 10 and a light reflecting layer RE in the present embodiment. In FIG. 6, four pixels PX adjacent to each other in the first direction X and the second direction Y are shown. In the figure, the light reflecting layer RE is hatched.

As shown in FIG. 6, each of the pixels PX includes a first-color light emitting element 10a, a second-color light emitting element 10b and a third-color light emitting element 10c. The light emitting element 10a is mounted on the pixel electrode PEa, the light emitting element 10b is mounted on the pixel electrode PEb, and the light emitting element 10c is mounted on the pixel electrode PEc (FIG. 5).

In the present embodiment, there is a one-to-one correspondence between the openings OP1 and the light emitting elements 10. In a planar view, one opening OP1 is formed to completely expose its corresponding one of the light emitting elements 10. In other words, in a planar view, the light reflecting layer RE overlaps none of the light emitting elements 10. The present embodiment thus makes it possible to avoid the situation that the light emission of the light emitting elements 10 is shielded by the light reflecting layer RE. Since the luminance level of a displayed image is not lowered by the light reflecting layer RE, the user can view the image displayed by the display device 1 satisfactorily.

In the present embodiment, the light emitting elements 10 each have quadrangular shape in a planar view. The sides of each light emitting element 10 are parallel to the first direction X or the second direction Y. The width W1 of each side of the light emitting element 10 is, for example, 4 µm to 5 µm. The openings OP1 each have quadrangular shape in a planar view. The sides of each opening OP1 are parallel to the first direction X or the second direction Y. The width W2 of each side of the opening OP1 is larger than the width W1.

The display device 1 according to the first embodiment configured as described above includes the insulating substrate 20, the base layer BL, the light emitting elements 10, the resin layer 31 and the light reflecting layer RE. The resin layer 31 is provided on the base layer BL, filled in the gap between the light emitting elements 10, and has a flat surface SU2. The light reflecting layer RE is provided above the flat surface SU2 and has a mirror surface MS and a plurality of openings OP1.

Providing the openings OP1 in the light reflecting layer RE makes an area for reflecting external light by the mirror surface MS and areas for emitting light from the light emitting elements 10 independent of each other. The display device 1 can thus display an image while preventing light reflection properties from decreasing.

First Modification to First Embodiment

Figure 7:
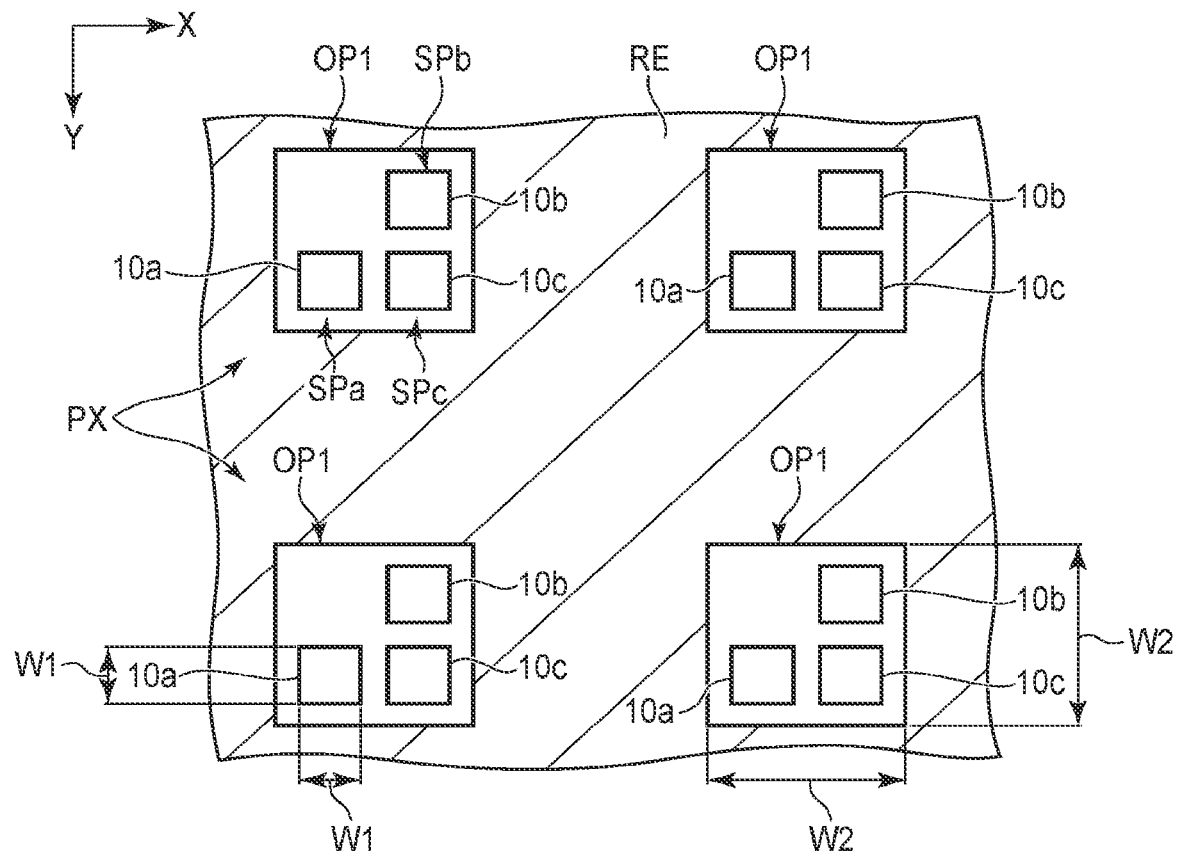
FIG. 7 is a plan view showing a plurality of light emitting elements and a light reflecting layer in a first modification to the first embodiment.

Next is a description of a first modification to the first embodiment described above. FIG. 7 is a plan view showing a plurality of light emitting elements 10 and a light reflecting layer RE of the first modification to the foregoing first embodiment.

As shown in FIG. 7, the first modification differs from the first embodiment in that each opening OP1 overlaps at least two of the light emitting elements 10. Each opening OP1 overlaps a light emitting element (first light emitting element) 10a, a light-emitting element (second light emitting element) 10b and a light-emitting element (third light emitting element) 10c of a corresponding one of the pixels PX. In the first modification, too, the light reflecting layer RE overlaps none of the light emitting elements 10 in a planar view.

In the first modification, the width W1 of each light emitting element 10 is, for example, 4 µm to 5 µm. The width W2 of each opening OP1 is larger than the width W1. The width W2 is, for example, 10 µm to 20 µm. Preferably, the width W2 is 15 µm to 20 µm.

The display device 1 according to the first modification to the first embodiment configured as described above can also bring about the same advantages as those of the first embodiment. As compared with the first embodiment, the first modification makes it possible to assemble three light emitting elements 10 densely for each pixel PX to decrease the number of openings OP1 in the light reflecting layer RE and to increase the area of the mirror surface MS. The light reflection properties can thus be prevented from decreasing further.

Second Modification to First Embodiment

Figure 8:
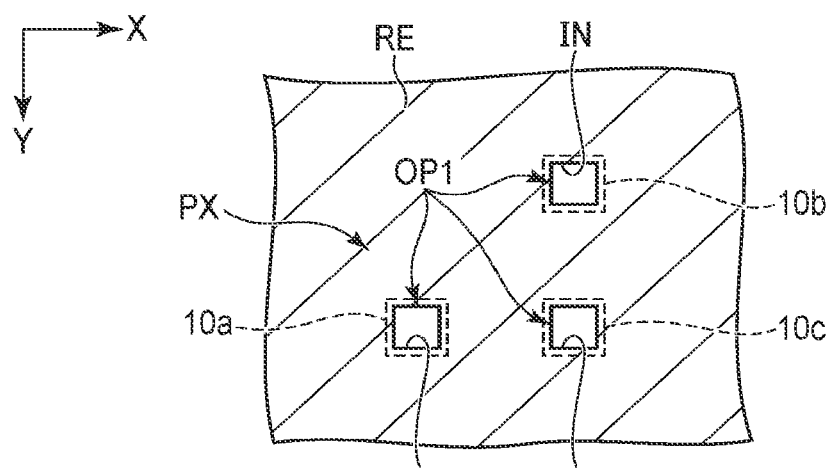
FIG. 8 is a plan view showing a plurality of light emitting elements and a light reflecting layer in a second modification to the first embodiment.

Next is a description of a second modification to the first embodiment. FIG. 8 is a plan view showing a plurality of light emitting elements 10 and a light reflecting layer RE of the second modification to the foregoing first embodiment.

As shown in FIG. 8, the second modification differs from the first embodiment in that the light reflecting layer RE overlaps the light emitting elements 10.

In a planar view, at least part of the inner periphery IN of the light reflecting layer RE in each opening OP1 overlaps the light emitting elements 10. In the second modification, the entire inner periphery IN overlaps the light emitting elements 10.

The display device 1 according to the second modification to the first embodiment configured as described above also brings about the same advantages as those of the first embodiment. As compared with the first embodiment, the second modification makes it possible to increase the area of the mirror surface MS. Thus, the display device 1 is further excellent in light reflection properties.

Third Modification to First Embodiment

Figure 9:
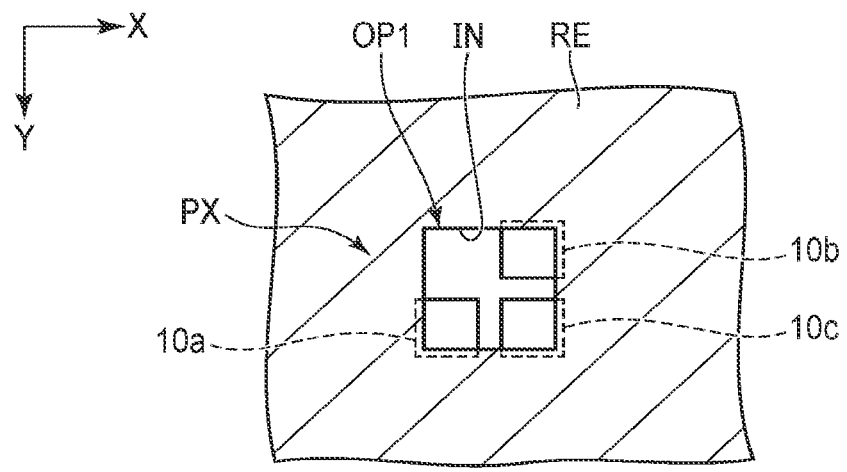
FIG. 9 is a plan view showing a plurality of light emitting elements and a light reflecting layer in a third modification to the first embodiment.

Next is a description of a third modification to the first embodiment. FIG. 9 is a plan view showing a plurality of light emitting elements 10 and a light reflecting layer RE of the third modification to the foregoing first embodiment.

As shown in FIG. 9, the third modification differs from the foregoing first modification (FIG. 7) in that the light reflecting layer RE overlaps the light emitting elements 10.

In a planar view, at least part of the inner periphery IN of the light reflecting layer RE in each opening OP1 overlaps the light emitting elements 10. In the third modification, the inner periphery IN overlaps three light emitting elements 10 of the pixel PX.

The display device 1 according to the third modification to the first embodiment configured as described above also brings about the same advantages as those of the first modification. As compared with the first modification, the third modification makes it possible to increase the area of the mirror surface MS. Thus, the display device 1 is further excellent in light reflection properties.

Fourth Modification to First Embodiment

Figure 10:
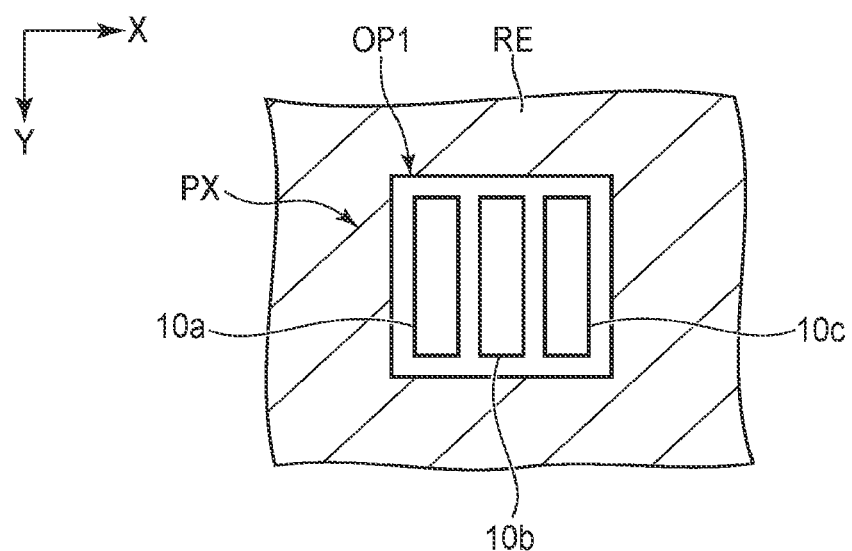
FIG. 10 is a plan view showing a plurality of light emitting elements and a light reflecting layer in a fourth modification to the first embodiment.

Next is a description of a fourth modification to the first embodiment. FIG. 10 is a plan view showing a plurality of light emitting elements 10 and a light reflecting layer RE of the fourth modification to the foregoing first embodiment.

As shown in FIG. 10, the light emitting elements 10a, 10b and 10c (pixel electrodes PEa, PEb and PEc) of the pixel PX may be arranged in the first direction X, extended in the second direction Y and arranged in stripes (vertical stripes).

The opening OP1 overlaps the light emitting elements 10a, 10b and 10c of one pixel PX. In a planar view, the light reflecting layer RE overlaps none of the light emitting elements 10. However, the relationship between the opening OP1 and the light emitting elements 10 is not limited to this example. As in the first embodiment (FIG. 6), there may be a one-to-one correspondence between the openings OP1 and the light emitting elements 10. Alternatively, as in the second modification (FIG. 8) and the third modification (FIG. 9), the light reflecting layer RE may overlap each of the light emitting elements 10.

The display device 1 according to the fourth modification to the first embodiment configured as described above also brings about the same advantages as those of the first embodiment.

Second Embodiment

Figure 11:
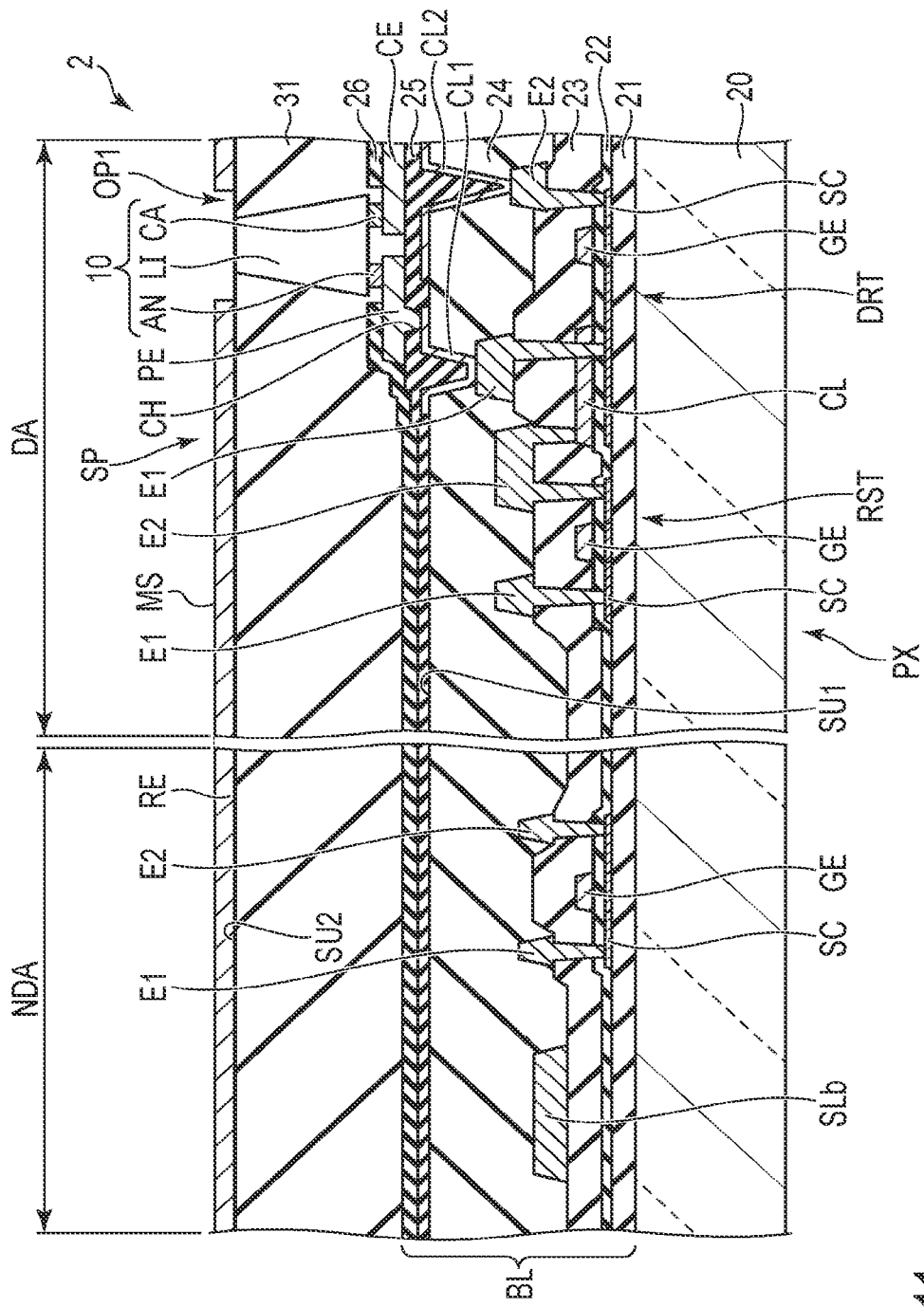
FIG. 11 is a partial sectional view showing a display panel of a display device according to a second embodiment.

Next is a description of a display device according to a second embodiment. FIG. 11 is a partial sectional view showing a display panel 2 of a display device 1 according to the second embodiment.

As shown in FIG. 11, the second embodiment differs from the first embodiment in the location where the common electrode CE is provided and the configuration of the light emitting element 10. The common electrode CE is located on the insulating layer 25. The common electrode CE is formed of the same material as that of the pixel electrodes PE, for example. The common electrode CE is connected to the low-potential power supply line SLb. The insulating layer 26 is provided on the insulating layer 25, pixel electrode PE and common electrode CE. The insulating layer 26 has an opening through which the light emitting element 10 is connected to the pixel electrode PE and the common electrode CE.

In the light emitting element 10, not only the anode AN but also the cathode CA is located alongside the base layer BL. The anode AN is connected to the pixel electrode PE, and the cathode CA is connected to the common electrode CE.

The light reflecting layer RE is provided on the flat surface SU2 of the resin layer 31. In the second embodiment, there is no electrical limitation on the light reflecting layer RE. For example, the light reflecting layer RE may be fixed to a low potential such as a ground potential. Alternatively, the light reflecting layer RE may be in an electrically floating state.

The display device 1 according to the second embodiment configured as described above also brings about the same advantages as those of the first embodiment.

Third Embodiment

Next is a description of a display device according to a third embodiment. FIG. 12 is a partial sectional view showing a display panel 2 of a display device 1 according to the third embodiment.

As shown in FIG. 12, the third embodiment differs from the above-described embodiments in that the display panel 2 further includes a transparent conductive layer 51, a dimming layer LD and the like.

The light reflecting layer RE is provided above the base layer BL. In the third embodiment, the light reflecting layer RE is provided above the resin layer 31. Specifically, the light reflecting layer RE is provided on the common electrode CE. The light reflecting layer RE includes a mirror surface MS located on the opposite side of the surface facing the base layer BL, and a plurality of openings OP1 superposed on the light emitting elements 10.

The display panel 2 further includes an alignment film AF1, a transparent insulating substrate 50, a transparent conductive layer 51, an alignment film AF2, a dimming layer LD and a polarizer PO. In the present embodiment, the dimming layer LD is a liquid crystal layer formed of a liquid crystal material. The alignment film AF1 is provided on the common electrode CE and the light reflecting layer RE.

The insulating substrate 50 is opposed to the alignment film AF1 with a gap therebetween. On the surface of the insulating substrate 50, which faces the alignment film AF1, the transparent conductive layer 51 and the alignment film AF2 are arranged in this order. As the insulating substrate 50, a glass substrate such as quartz and alkali-free glass or a resin substrate such as polyimide can be mainly used. When the insulating substrate 50 is a flexible resin substrate, the display device 1 can be configured as a sheet display. The resin substrate is not limited to polyimide but can be formed using other resin materials.

The transparent conductive layer 51 is opposed to the mirror surface MS of the light reflecting layer RE with a gap therebetween. The transparent conductive layer 51 is formed using, for example, ITO as a transparent conductive material. An insulating layer may be added between the insulating substrate 50 and the transparent conductive layer 51. For example, when the insulating substrate 50 is a resin substrate, an inorganic insulating film may be added between the insulating substrate 50 and the transparent conductive layer 51.

The dimming layer LD is located between the light reflecting layer RE and the transparent conductive layer 51. The dimming layer LD is held between the alignment films AF1 and AF2. The alignment films AF1 and AF2 are in contact with the dimming layer LD.

Unlike in the present embodiment, the dimming layer LD may be formed of an electrophoretic dispersion. In this case, the alignment films AF1 and AF2 may be replaced with insulating layers (inorganic insulating layers).

The dimming layer LD has a dimming function of adjusting brightness. The transparent conductive layer 51 is driven by the driver 7. A voltage, which is to be applied between the light reflecting layer RE (common electrode CE) and the transparent conductive layer 51, can be applied to the dimming layer LD. The polarizer PO is disposed on one side of the insulating substrate 50 which is opposite to the other side facing the transparent conductive layer 51.

The liquid crystal molecules of a dimming layer (liquid crystal layer) LD contribute to the modulation factor of light (polarized light) and can increase and decrease the modulation factor. The dimming layer LD can thus adjust the transmittance of light struck onto the mirror surface MS and reflected by the mirror surface MS. Since the light reflecting layer RE can also function as an antiglare mirror together with the dimming layer LD, the polarizer PO, etc., the user can view the images displayed by the display device 1 more satisfactorily.

The display device 1 according to the third embodiment configured as described above also brings about the same advantages as those of the foregoing first embodiment. Since the display device 1 further includes the transparent conductive layer 51, dimming layer LD and the like, it can also function as an antiglare mirror.

Fourth Embodiment

Figure 13:
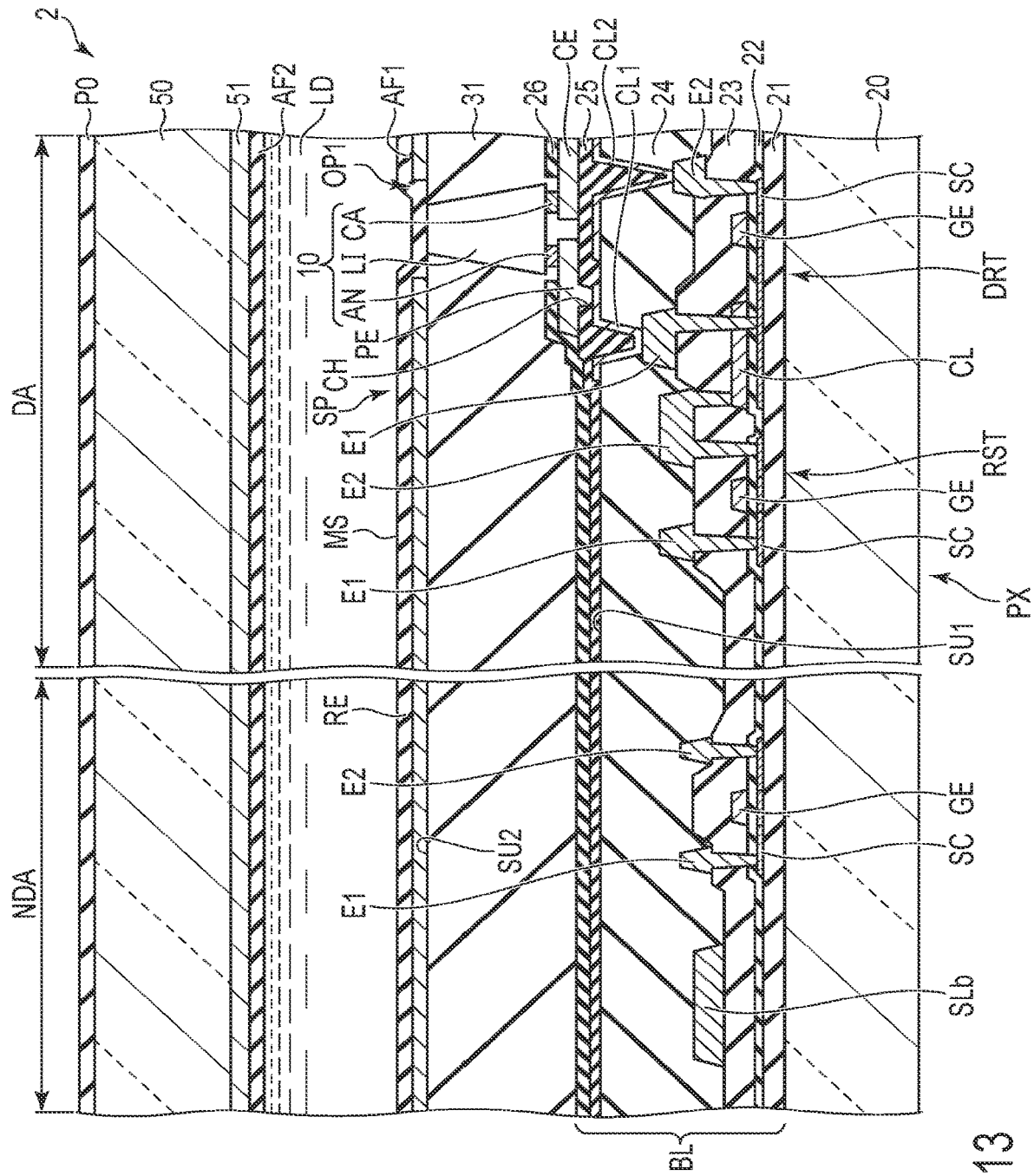
FIG. 13 is a partial sectional view showing a display panel of a display device according to a fourth embodiment.

Next is a description of a display device according to a fourth embodiment. FIG. 13 is a partial sectional view showing a display panel 2 of a display device 1 according to the fourth embodiment.

As shown in FIG. 13, the technique of the fourth embodiment corresponds to the combination of the technique of the second embodiment (FIG. 11) and that of the third embodiment (FIG. 12).

The common electrode CE is located on the insulating layer 25. The insulating layer 26 is provided on the insulating layer 25, pixel electrode PE and common electrode CE. The insulating layer 26 has an opening through which the light emitting element 10 is connected to the pixel electrode PE and the common electrode CE. In the light emitting element 10, the anode AN is connected to the pixel electrode PE, and the cathode CA is connected to the common electrode CE. The light reflecting layer RE is provided on the flat surface SU2 of the resin layer 31. In the fourth embodiment, the light reflecting layer RE is driven by the driver 7.

The display panel 2 further includes an alignment film AF1, an insulating substrate 50, a transparent conductive layer 51, an alignment film AF2, a dimming layer LD and a polarizer PO. A voltage, which is to be applied between the light reflecting layer RE and the transparent conductive layer 51, can be applied to the dimming layer LD. The dimming layer LD has a dimming function. Since the light reflecting layer RE can also function as an antiglare mirror together with the dimming layer LD, the polarizer PO, etc., the user can view the images displayed by the display device 1 more satisfactorily.

Note that the light reflecting layer RE is not formed in an area overlapping the light emitting element 10, but has an opening OP1 in an area overlapping the light emitting element 10. Therefore, even though a voltage is applied between the light reflecting layer RE and the transparent conductive layer 51, the alignment state of an area of the dimming layer LD, which overlaps the light emitting element 10, is hardly changed.

The display device 1 according to the fourth embodiment configured as described above also brings about the same advantages as those of the third embodiment.

Fifth Embodiment

Figure 14:
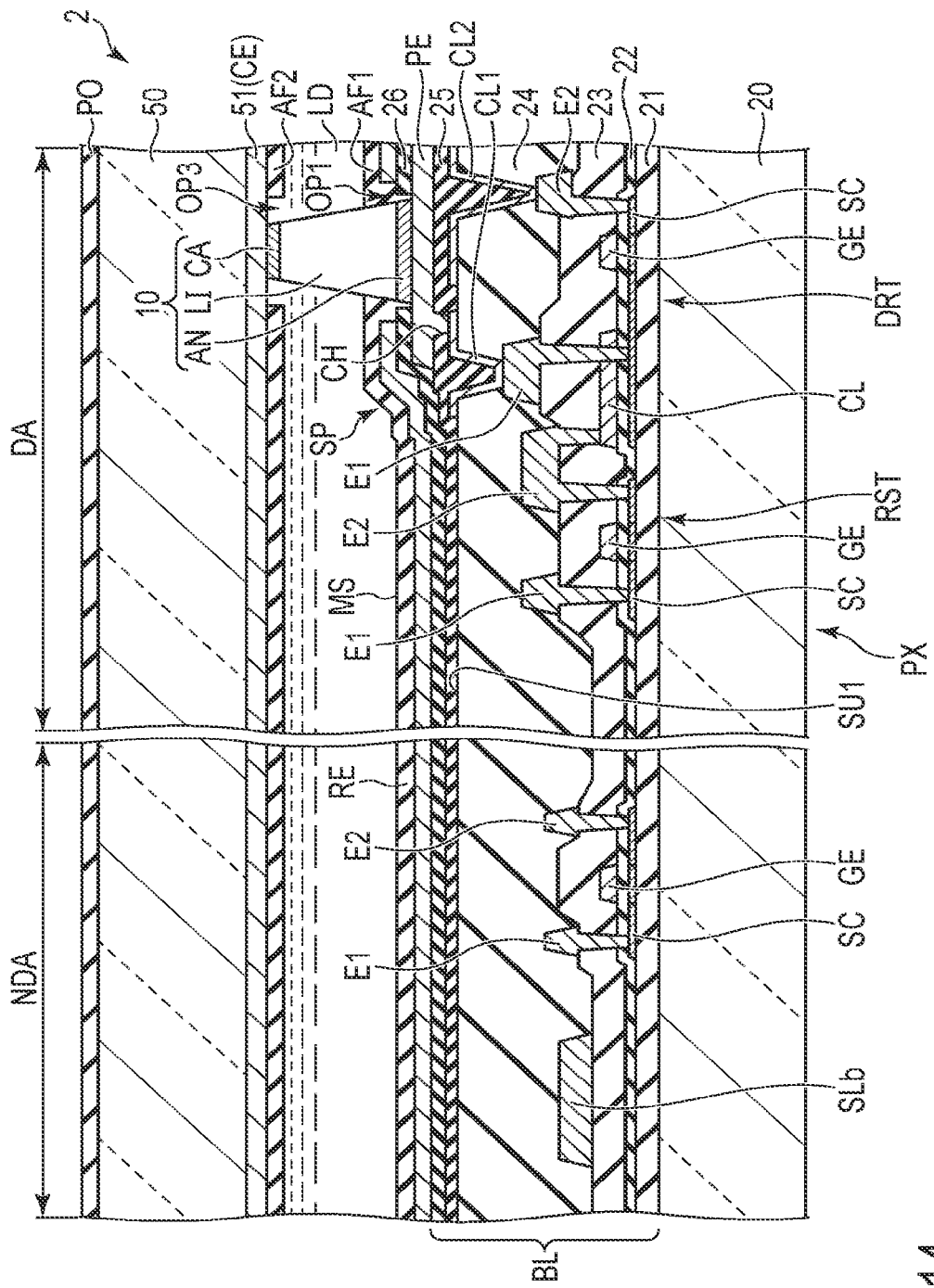
FIG. 14 is a partial sectional view showing a display panel of a display device according to a fifth embodiment.

Next is a description of a display device according to a fifth embodiment. FIG. 14 is a partial sectional view showing a display panel 2 of a display device 1 according to the fifth embodiment.

As shown in FIG. 14, the fifth embodiment differs from the third embodiment (FIG. 12) in that the display panel 2 does not include the resin layer 31. Since the light reflecting layer RE is disposed above the flat surface SU2, the mirror surface MS is flat. The insulating layer 24 of the base layer BL is a resin layer and has a flat surface SU1 that is the opposite side of the surface facing the insulating substrate 20.

The transparent conductive layer 51 is a common electrode CE. The alignment film AF2 has an opening OP3 in an area overlapping the light emitting element 10. The opening OP3 is formed to expose the transparent conductive layer 51. The dimming layer LD is filled in a gap between the light emitting elements 10. In each of the light emitting elements 10, an anode AN is electrically connected to a corresponding one of the pixel electrodes PE, a cathode CA is located opposite to the anode AN, and a light emitting layer LI is located between the anode AN and the cathode CA. The transparent conductive layer 51 is electrically connected to the cathodes CA of the light emitting elements 10.

The transparent conductive layer 51 is held at the same constant potential as the potential of the low-potential power supply line SLb, and electrically connects the low-potential power supply line SLb to the cathodes CA of all of the light emitting elements 10. The light reflecting layer RE is driven by the driver 7. A voltage, which is to be applied between the light reflecting layer RE and the transparent conductive layer 51, can be applied to the dimming layer LD.

The display device 1 according to the fifth embodiment configured as described above also brings about the same advantages as those of the third embodiment.

Next is a description of the application of the display device 1 described above.

As shown in FIG. 15, a mirror 12 on a dresser 11 may be configured by the display device 1 (display panel 2) described above. The mirror 12 has not only its original function but also a function of displaying an image PI not caused by external light. Here is an example in which the mirror 12 displays the image PI of a character string "ABC".

As shown in FIG. 16, an inner rearview mirror 13 may be configured by the display device 1 (display panel 2) described above. The inner rearview mirror 13 has not only a function as a mirror but also a function of displaying an image PI. Here is an example in which the inner rearview mirror 13 displays the image PI of a character string "ABC".

Figure 17:
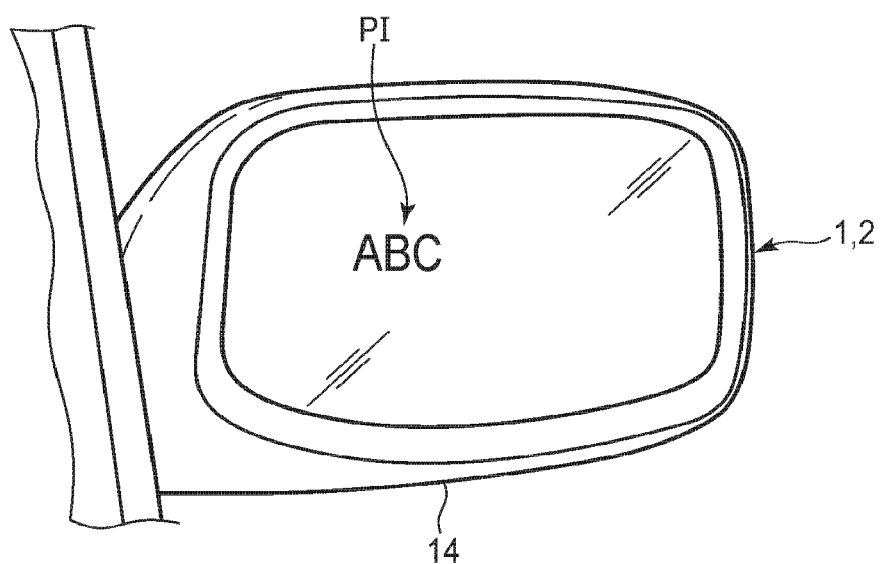
FIG. 17 is an illustration showing an example in which the display device (display panel) is applied to a sideview mirror.

As shown in FIG. 17, a sideview mirror 14 may be configured by the display device 1 (display panel 2) described above. Here is an example in which the sideview mirror 14 displays the image PI of a character string "ABC".

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions. When necessary, a plurality of embodiments and a plurality of modifications can be combined.

For example, the light emitting elements 10 may be spontaneous light emitting elements other than a micro LED such as a mini LED. Note that the micro LED has a width W1 of 100 μm or less, and the mini LED has a width W1 of more than 100 μm and 200 μm or less.

What is claimed is:

1. A display device comprising:
   a substrate;
   a base layer provided on the substrate;
   a plurality of light emitting elements mounted on the base layer;
   a resin layer provided on the base layer, filled in a gap between the light emitting elements, and having a flat surface on an opposite side of a surface facing the base layer; and
   a light reflecting layer provided above the flat surface and including a mirror surface located on an opposite side of a surface facing the flat surface and a plurality of openings overlapping the light emitting elements,
   the light reflecting layer overlapping none of the light emitting elements in a planar view.

2. The display device of claim 1, wherein each of the openings overlaps two or more of the light emitting elements.

3. The display device of claim 2, further comprising a plurality of pixels each including a first light emitting element of a first color, a second light emitting element of a second color and a third light emitting element of a third color among the light emitting elements,
   wherein each of the openings overlaps the first light emitting element, the second light emitting element and the third light emitting element of a corresponding one of the pixels.

4. The display device of claim 1, wherein each of the light emitting elements is a micro light emitting diode.

5. A display device comprising:
   a substrate;
   a base layer provided on the substrate;
   a plurality of light emitting elements mounted on the base layer;
   a resin layer provided on the base layer, filled in a gap between the light emitting elements, and having a flat surface on an opposite side of a surface facing the base layer;
   a light reflecting layer provided above the flat surface and including a mirror surface located on an opposite side of a surface facing the flat surface and a plurality of openings overlapping the light emitting elements; and
   a common electrode provided above the flat surface and formed of a transparent conductive material,
   wherein:
   the base layer includes a plurality of pixel electrodes on which the light emitting elements are mounted;
   each of the light emitting elements includes:
      a first electrode electrically connected to a corresponding one of the pixel electrodes;
      a second electrode opposed to the first electrode; and
      a light emitting layer located between the first electrode and the second electrode;
   the resin layer is formed to expose the second electrode of each of the light emitting elements; and
   the common electrode is electrically connected to the second electrode of each of the light emitting elements.

6. The display device of claim 5, wherein the light reflecting layer is formed of metal and is in contact with the common electrode.

* * * * *